United States Patent
Purdy et al.

(10) Patent No.: US 6,734,088 B1
(45) Date of Patent: May 11, 2004

(54) CONTROL OF TWO-STEP GATE ETCH PROCESS

(75) Inventors: Matthew Purdy, Austin, TX (US); Scott G. Bushman, Austin, TX (US); James H. Hussey, Jr., Austin, TX (US); Douglas J. Bonser, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 318 days.

(21) Appl. No.: 09/661,536

(22) Filed: Sep. 14, 2000

(51) Int. Cl.$^7$ .................................. H01L 21/3205
(52) U.S. Cl. .................. 438/585; 438/714; 438/719
(58) Field of Search ........................ 438/585, 701, 438/714, 719, 720, 734

(56) References Cited

U.S. PATENT DOCUMENTS 6,274,503 B1 * 8/2001 Hsieh .......................... 438/734

* cited by examiner

Primary Examiner—Tuan H. Nguyen
Assistant Examiner—Jack Chen
(74) Attorney, Agent, or Firm—Williams, Morgan & Amerson, P.C.

(57) ABSTRACT

The present invention is directed to a method of controlling an etching process used to form a gate electrode on a semiconductor device. In one embodiment, the method comprises forming a layer of silicon dioxide above a semiconducting substrate, and forming a layer of polysilicon above the layer of silicon dioxide. The method further comprises sensing a thickness of the layer of polysilicon and adjusting, based upon the sensed thickness of said layer of polysilicon, at least one parameter of an etching process to be performed on said layer of polysilicon to define a gate electrode of a transistor, said etching process comprised of at least a timed etch process and an endpoint etch process.

11 Claims, 3 Drawing Sheets

000
CONTROL OF TWO-STEP GATE ETCH PROCESS

BACKGROUND OF THE INVENTION

1. Field of the Invention

This invention relates generally to the field of semiconductor processing, and, more particularly, to the field of forming gate electrodes on a semiconductor device, e.g., a transistor.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

As device dimensions have continued to decrease, the process of forming the gate electrode of a transistor have become more critical. By way of background, FIG. 1 depicts a partially formed transistor 10 comprised of a gate electrode 16 and a gate insulation layer 14. The gate electrode 16 has a top surface 15. In general, the structure depicted in FIG. 1 may be formed by forming the appropriate process layers above a semiconducting substrate 12 and, thereafter, performing one or more etching operations to define the gate electrode 16 and the gate insulation layer 14. The gate insulation layer 14 may be comprised of a variety of insulating materials, such as silicon dioxide, and the gate electrode 16 may be comprised of a variety of materials, although it is normally comprised of polysilicon in modern devices.

Typically, in modern device fabrication, a two-step etch process is used to pattern the gate electrode 16. Initially, a timed etch process, sometimes referred to as a main etch, is performed to etch through the bulk of the thickness of the layer of material, e.g., polysilicon, from which the gate electrode 16 will be formed. With reference to FIG. 2, which is an enlarged and exaggerated view of a portion of the device shown in FIG. 1, this timed etch process may be performed in the region indicated by line 23. This timed etch process is normally performed using an etching recipe that does not have a high degree of selectivity with respect to silicon dioxide, a common material used for the gate insulation layer 14. However, the timed etch process typically does produce a relatively straight sidewall 18 of the gate electrode 16 in the region 23.

As stated previously, the timed etch process is used to etch through the bulk of the thickness of the initially formed layer of material from which the gate electrode 16 will be formed. However, at some point, it becomes necessary to use an endpoint etch process so that the underlying gate insulation layer 14 comprised of, for example, silicon dioxide, will not be consumed in completing the formation of the gate electrode 16. This endpoint etch process may be performed in the region indicated by line 24 in FIG. 2. Such endpoint etching processes often rely on optical emission spectrometry to determine when the process endpoint is reached. That is, by analyzing the outgassing of the etching process, it can be determined when substantially all of the polysilicon is consumed and/or when portions of the underlying gate insulation layer 14 are beginning to be consumed. At that point, the process is halted.

The endpoint etch process described above is normally highly selective with respect to the material of the gate insulation layer 14, e.g., silicon dioxide. However, one drawback with respect to such an endpoint etching process is that it does not produce as vertical a sidewall as would otherwise be desired. That is, in the region 24 where this endpoint etch process is performed, the sidewalls 18 of the gate electrode 16 tend to flare, as indicated by line 20 in FIG. 2. This flaring, while problematic in and of itself, can be accommodated in designing the semiconductor device. That is, knowing the amount of this flaring, the transistor may otherwise be designed such that it operates within a desired range of performance characteristics.

However, problems do arise when the incoming layer of material from which the gate electrode 16 will be formed is thicker or thinner than anticipated. For example, when the incoming layer of material is thicker than anticipated, performing a timed etch process based upon the anticipated thickness results in starting the endpoint etch process at a point higher above the surface 13 of the substrate 12 than would otherwise be desired, thereby producing a profile similar to that indicated by dashed lines 22 in FIG. 2. Note that, in this situation, the flaring of the gate electrode 16 is greater than would otherwise be anticipated, thereby increasing the effective channel length of the device and producing a slower device. In the depicted embodiment, the channel length of the device would be increased by a magnitude that is approximately twice that of the dimension 29 indicated in FIG. 2. Conversely, in situations where the incoming layer of material from which the gate electrode will be formed is thinner than anticipated, performing a timed etch process based upon the anticipated thickness of the layer may result, in the worst case, in consuming part of the underlying gate insulation layer 14 prior to beginning the endpoint etch process. Thus, variations in the thickness of the incoming layer used to form the gate electrode 16 may adversely impact device performance.

The present invention is directed to solving, or at least reducing, some or all of the aforementioned problems.

SUMMARY OF THE INVENTION

The present invention is directed to a method of controlling a gate etching process. In one illustrative embodiment, the method comprises forming a first layer comprised of a gate insulation material above a semiconducting substrate and forming a second layer of material above the layer of gate insulation material. The method further comprises sensing a thickness of the second layer of material, and adjusting, based upon the sensed thickness of the second layer of material, at least one parameter of an etching process to be performed on the second layer of material to define a gate electrode of a transistor, the etching process comprised of at least a timed etch process and an endpoint etch process. In one particularly illustrative embodiment, the layer of gate insulation material is comprised of silicon dioxide, and the layer from which the gate electrode will be formed is comprised of polysilicon.

BRIEF DESCRIPTION OF THE DRAWINGS

The invention may be understood by reference to the following description taken in conjunction with the accompanying drawings, in which like reference numerals identify like elements, and in which.

Figure 1:
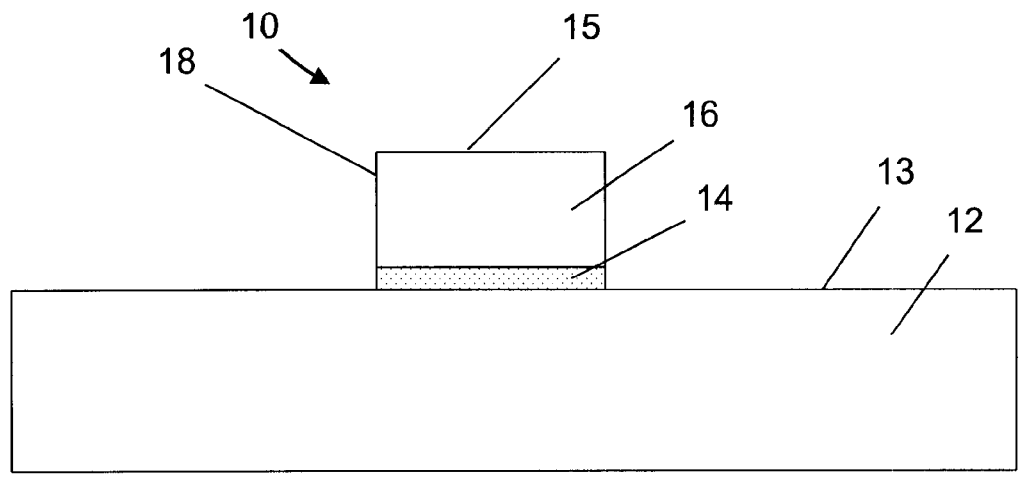
FIG. 1 is a cross-sectional view of a partially formed transistor.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 4:
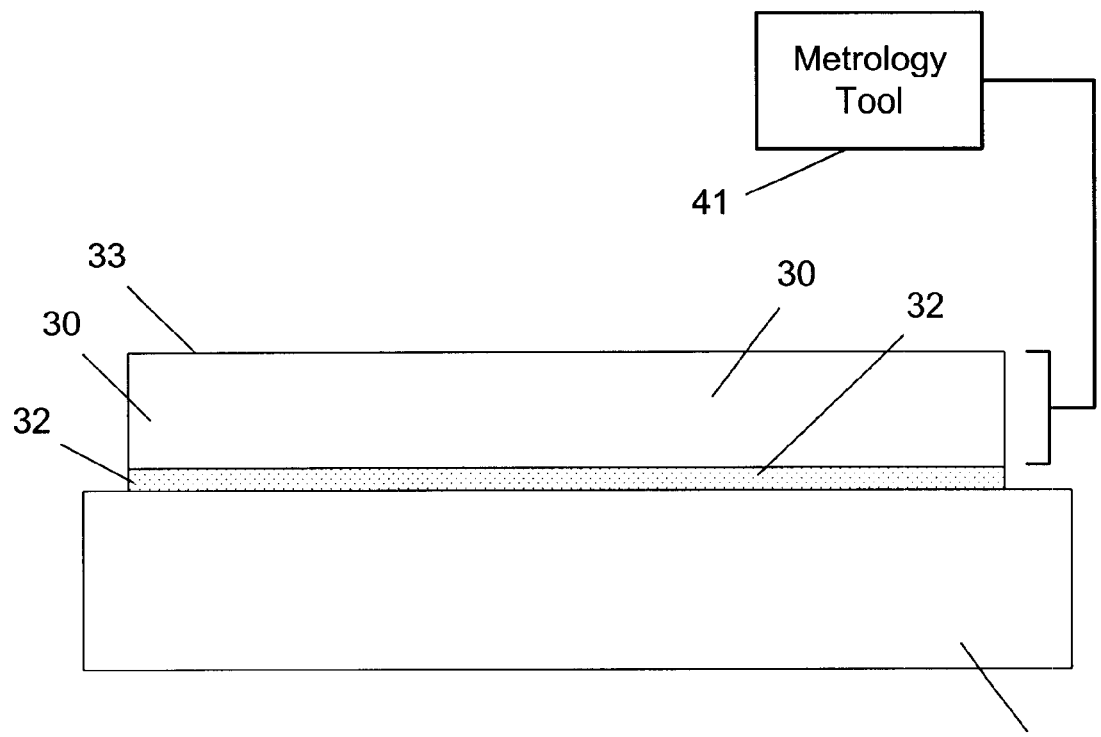
FIG. 4 is a cross-sectional view of a semiconducting substrate having a gate insulation layer and polysilicon layer formed thereabove.
Figure 3:
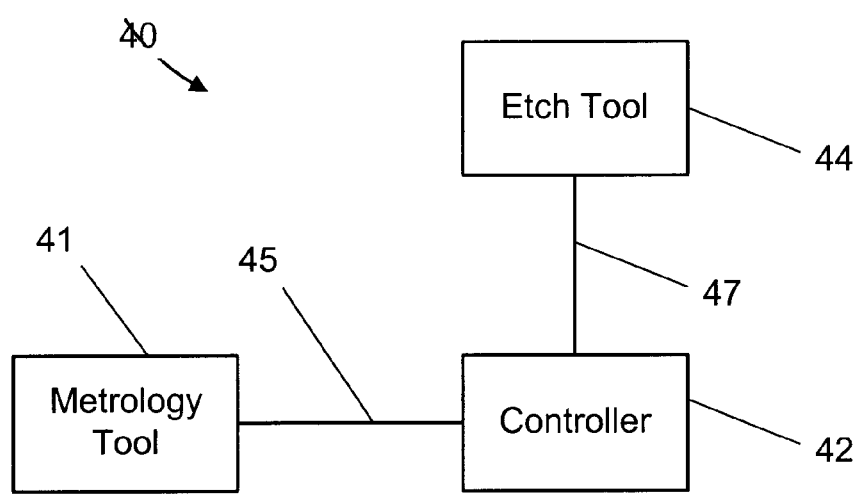
FIG. 3 is a block diagram of an illustrative system which may employ the present invention.

The present invention will now be described with reference to FIGS. 3–5. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and regions depicted in the drawings may be exaggerated or reduced as compared to the size of those features or regions on fabricated devices. Nevertheless, the attached drawings are included to describe and explain illustrative examples of the present invention.

In general, the present invention is directed to a method of controlling a two-step gate etch process, and, more particularly, to a two-step etch process for forming polysilicon gate electrodes. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

The present invention will now be described with reference to FIGS. 3 and 4. As shown in FIG. 3, a system 40 for use with the present invention may be comprised of a metrology tool 41, a controller 42, and an etch tool 44. As shown in FIG. 4, the metrology tool 41 may be used to measure or sense a thickness of a layer of material 30 formed above an insulation layer 32 formed above a semiconducting substrate 12. As will become apparent upon a complete reading of the present application, the insulation layer 32 and the layer 30 will be patterned, respectively, to form a gate insulation layer (not shown) and a gate electrode (not shown) of a finished semiconductor device by performing one or more etching processes.

Figure 2:
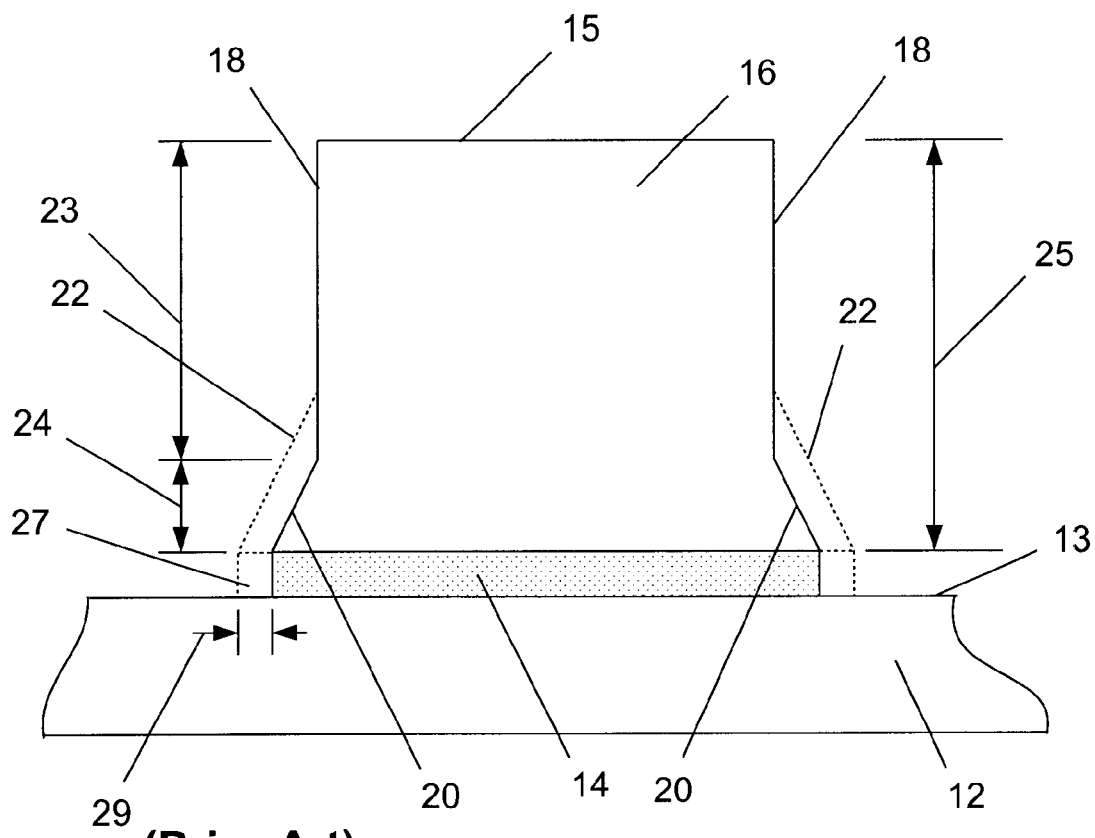
FIG. 2 is an enlarged, exaggerated view of a portion of the device depicted in FIG. 1.

In general, the particular materials and techniques used to form the various components or layers depicted in FIG. 2, e.g., the insulation layer 32 and the layer 30, are matters of design choice, and, thus, should not be considered a limitation of the present invention unless specifically set forth in the appended claims. For example, the insulation layer 32 may be comprised of silicon dioxide, silicon oxynitride, fluorinated oxide, etc., and it may be formed by, for example, a thermal growth process or a deposition process. Although not depicted in FIG. 1, the gate insulation layer may actually be comprised of two layers of different materials. Similarly, the layer 30 may be comprised of a variety of materials that may be used as a gate electrode on a finished device, such as polysilicon, and it may be formed by, for example, a physical vapor deposition ("PVD") or a chemical vapor deposition ("QVD") process. In one illustrative embodiment, the layer 30 is comprised of a layer of polysilicon having a thickness ranging from approximately 1000–4000 Å that is formed by a CVD process.

With respect to the system 40, the metrology tool 41 may be any type of tool useful in measuring or sensing the thickness of the layer of material 30, e.g., an ellipsometer, spectrophotometer, etc. In one illustrative embodiment, the metrology tool 41 is an ellipsometer Model No. Optiprobe 2600 sold by ThermaWave. The etch tool 44 may be any tool suitable for etching the layer 30 to form a gate electrode (not shown) of a semiconductor device. In one illustrative embodiment, the etch tool 44 is a DPS Poly Etch tool manufactured by Applied Materials.

In operation, the metrology tool 41 senses the thickness of the layer 30, and feeds that information forward to the controller 42 via line 45. Based upon that input, the controller 42 determines an etching recipe, or an adjustment to one or more parameters of an etching recipe, to be performed on the layer 30. That etching recipe is then performed on the layer 30 in the etch tool 44 to thereby define a gate electrode for a semiconductor device.

According to the present invention, a two-step etching process is used to form the gate electrode, i.e., a timed etch process and an endpoint etch process. The endpoint etch process may use optical emission spectrometry to determine the endpoint of the process. In accordance with one embodiment of the present invention, the desired starting point of the endpoint etch process may be treated as essentially fixed, and the duration of the timed etch process may be varied in response to the determined thickness of the layer 30. That is, knowing that approximately "X" amount of the layer 30 will be consumed during an endpoint etch process, then the duration of the timed etch process, used to consume the bulk of the layer 30, may be adjusted based upon the incoming thickness. In this situation, the starting point of the endpoint process, and thus the amount of the layer 30 removed during the endpoint process, is essentially treated as a constant that is essentially independent of the incoming thickness of the layer 30.

Alternatively, the amount of the layer 30 consumed during the endpoint etch process and the amount of the layer 30 consumed during the timed etch process may be expressed as a ratio. For example, the etching process may be designed such that, based upon an anticipated thickness of the layer 30, approximately 90% of the layer 30 is consumed during the timed, main etch process, and approximately 10% of the layer 30 is consumed during the endpoint etch process. If this ratio is treated as fixed, then the duration of the timed etch process may be varied based upon the thickness of the incoming layer 30, as determined by the metrology tool 41. For example, whatever the incoming thickness of the layer 30, it may be desirable that a predetermined fixed amount, for example, approximately 90% of its thickness, be consumed during the main or timed etch process. Knowing the incoming thickness of the layer 30, and the etch rate of the etching recipe to be performed during the timed etch process, the duration of the time etch process that will consume the fixed amount of the thickness of the layer 30, e.g., approximately 90%, may be readily determined.

Figure 5:
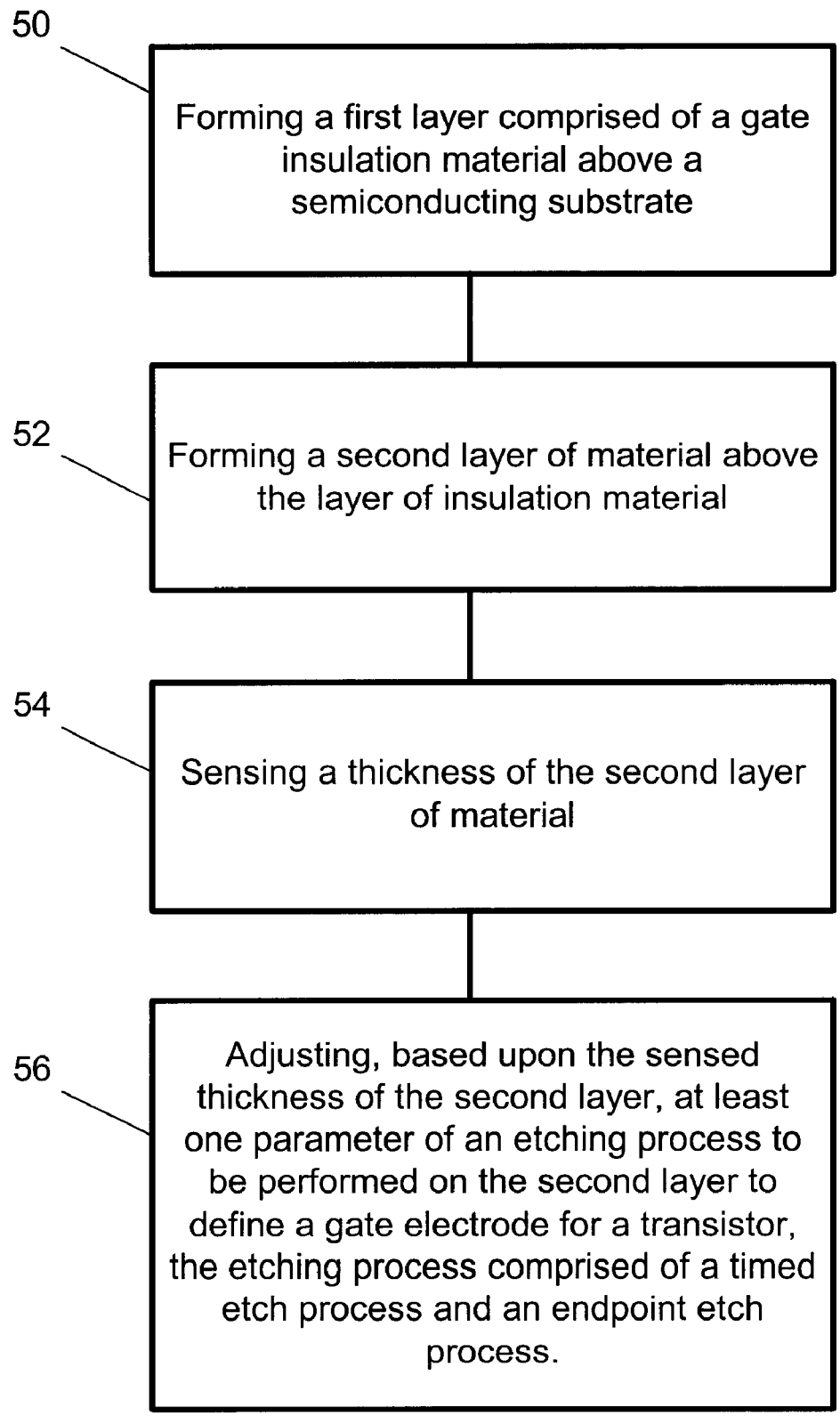
FIG. 5 is a flowchart depicting one illustrative embodiment of the present invention.

One illustrative embodiment of the present invention is depicted in flowchart in FIG. 5. As shown therein, the method comprises forming a first layer (e.g., layer 32) comprised of a gate insulation material above a semiconducting substrate, as indicated at block 50, forming a second layer of material (e.g., layer 30) above the layer of gate insulation material, as indicated at block 52, sensing a thickness of the second layer of material, as indicated at block 54, and adjusting, based upon the sensed thickness of the second layer, at least one parameter of an etching process to be performed on the second layer of material to define a gate electrode of a transistor, said etching process comprised of a timed etch process and an endpoint etch process, as set forth at block 56.

In another illustrative embodiment, the present invention comprises forming an insulating layer comprised of silicon dioxide above a semiconducting substrate, and forming a layer of polysilicon above the insulating layer. The method continues with sensing a thickness of the layer of polysilicon, and adjusting, based upon the sensed thickness of the layer of polysilicon, at least one parameter of an etching process to be performed on the layer of polysilicon to define a gate electrode of a transistor, the etching process being comprised of a timed etch process and an endpoint etch process.

In one embodiment, the controller 42 interfaces with the metrology tool 41. The thickness of the layer 30 is sensed by the metrology tool 41, and that information is supplied to the controller 42, via line 45. Thereafter, the controller 42 determines and/or controls at least one parameter of the etching process used to etch the layer of material 30 to define a gate electrode of a transistor. That is, the thickness of the layer 30 is supplied to the controller 42, and one or more parameters of the etching process is determined or adjusted based upon this measured or determined thickness.

In the illustrated embodiment, the controller 42 is a computer programmed with software to implement the functions described. Moreover, the functions described for the controller 42 may be performed by one or more controllers spread throughout the system 40. Additionally, the controller 42 may be a stand-alone controller, or it may be a controller resident on the etch tool 44. However, as will be appreciated by those of ordinary skill in the art, a hardware controller (not shown) designed to implement the particular functions may also be used. Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 42, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699-Provisional Specification for CIM Framework Domain Architecture) and APC (SEMI E93-0999-Provisional Specification for CIM Framework Advanced Process Control Component) specifications are publicly available from SEMI.

Referring to FIG. 5, the thickness sensing, as indicated at block 54, may be performed by one or more sensors, and it may represent a single or multiple readings of the layer 30. These sensors may be part of a stand-alone metrology tool, or they may be resident within the etch tool 44. Moreover, the sensed value may represent an average or some other statistical sampling of multiple readings provided by one or more sensors. With respect to the step indicated at block 56, the present invention may be used to adjust or determine a single process parameter, multiple process parameters, or an entire etching process recipe.

Moreover, a database may be developed that correlates an entire two-step etching recipe, or a parameter of the recipe, e.g., duration, temperature, gas flow rate, RF power, pressure, etc., with the sensed thickness of the layer 30. Alternatively, a calculation, based upon the sensed thickness of the layer 30, may be made to determine an adjustment to be made to one or more of the process parameters, e.g., duration, temperature, gas flow rate, etc. Additionally, a model may be developed that correlates one or more parameters of the etching process with the sensed thickness of the layer 30. Other methodologies are also possible.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

forming a first layer comprised of a gate insulation material above a semiconducting substrate;

forming a second layer of material above the first layer comprised of a gate insulation material;

sensing a thickness of the second layer of material;

performing an etching process comprised of a timed etch process and an endpoint etch process on said second layer of material to define a gate electrode of a transistor;

adjusting, based upon the sensed thickness of said second layer of material, at least one parameter of the timed etching process to be performed on said second layer of material while maintaining the amount of said second layer to be removed during the endpoint etch process essentially constant independent of said sensed thickness of said second layer of material.

2. The method of claim 1, wherein forming a first layer comprised of a gate insulation material above a semiconducting substrate comprises forming a first layer comprised of a gate insulation material above a semiconducting substrate, said gate insulation material comprised of at least one of silicon dioxide, silicon oxynitride, and a fluorinated oxide.

3. The method of claim 1, wherein forming a second layer of material above the first layer comprised of a gate insulation material comprises forming a second layer of material comprised of polysilicon above the first layer comprised of a gate insulation material.

4. The method of claim 1, wherein said thickness of said second layer represents an average thickness of said second layer.

5. The method of claim 1, wherein adjusting at least one parameter of the timed etching process to be performed on said second layer of material comprises adjusting at least one of a duration, a temperature, a gas flow rate, RF power and pressure of the timed etch process to be performed on said second layer of material.

6. A method, comprising:

forming a layer of a gate insulation material above a semiconducting substrate;

forming a layer of polysilicon above the layer of gate insulation material;

sensing a thickness of the layer of polysilicon;

performing an etching process comprised of a timed etch process and an endpoint etch process on said layer of polysilicon to define a gate electrode of a transistor; and adjusting, based upon the sensed thickness of said layer of polysilicon, at least one parameter of the timed etching process to be performed on said layer of polysilicon while maintaining the amount of said layer of polysilicon to be removed during the endpoint etch process essentially constant independent of said sensed thickness of said layer of polysilicon.

7. The method of claim 6, wherein forming a layer of a gate insulation material above a semiconducting substrate comprises forming a layer of a gate insulation material comprised of at least one of silicon dioxide, silicon oxynitride, and a fluorinated oxide above a semiconducting substrate.

8. The method of claim 6, wherein said thickness of said layer of polysilicon is an average thickness of said layer of polysilicon.

9. The method of claim 6, wherein adjusting at least one parameter of the timed etching process to be performed on said layer of polysilicon comprises adjusting at least one of a duration, a temperature, a gas flow rate, RF power and pressure of the timed etch process to be performed on said layer of polysilicon.

10. A method, comprising:

forming a first layer comprised of silicon dioxide above a semiconducting substrate;

forming a second layer comprised of polysilicon above the first layer comprised of silicon dioxide;

sensing a thickness of the second layer comprised of polysilicon;

performing an etching process comprised of a timed etch process and an endpoint etch process on said second layer comprised of polysilicon to define a gate electrode of a transistor; and adjusting, based upon the sensed thickness of the second layer comprised of polysilicon, the duration of a timed etching process to be performed on the second layer comprised of polysilicon while maintaining the amount of said second layer to be removed during the endpoint etch process essentially constant independent of said sensed thickness of said second layer comprised of polysilicon.

11. The method of claim 10, wherein said thickness of said second layer comprised of polysilicon is an average thickness of said second layer comprised of polysilicon.

* * * * *